(12) United States Patent
Nie et al.

(10) Patent No.: US 8,981,432 B2
(45) Date of Patent: Mar. 17, 2015

(54) METHOD AND SYSTEM FOR GALLIUM NITRIDE ELECTRONIC DEVICES USING ENGINEERED SUBSTRATES

(75) Inventors: Hui Nie, Cupertino, CA (US); Donald R. Disney, Cupertino, CA (US); Isik C. Kizilyalli, San Francisco, CA (US)

(73) Assignee: Avogy, Inc., San Jose, CA (US)

( * ) Notice: Subject to any disclaimer, the term of this patent is extended or adjusted under 35 U.S.C. 154(b) by 109 days.

(21) Appl. No.: 13/572,408

(22) Filed: Aug. 10, 2012

(65) Prior Publication Data
US 2014/0042447 A1  Feb. 13, 2014

(51) Int. Cl.
*H01L 29/80* (2006.01)

(52) U.S. Cl.
USPC .................... 257/265; 257/E29.313

(58) Field of Classification Search
CPC ................................. H01L 29/66909
USPC .................... 257/263, 264, 265, E29.313
See application file for complete search history.

(56) References Cited

U.S. PATENT DOCUMENTS

| | | | | |
|---|---|---|---|---|
| 7,638,379 | B2 * | 12/2009 | Cheng et al. ......... | 438/193 |
| 8,008,749 | B2 * | 8/2011 | Sugimoto et al. ...... | 257/615 |
| 2005/0072986 | A1 | 4/2005 | Sasaoka | |
| 2006/0154389 | A1 | 7/2006 | Doan | |
| 2007/0278540 | A1 | 12/2007 | Hoshino et al. | |
| 2010/0276700 | A1 | 11/2010 | Edmond et al. | |
| 2010/0320530 | A1 | 12/2010 | Cheng | |
| 2011/0031579 | A1 | 2/2011 | Parikh et al. | |
| 2011/0114965 | A1 | 5/2011 | Letertre | |
| 2011/0134954 | A1 | 6/2011 | Letertre | |
| 2011/0301665 | A1 | 12/2011 | Mercanzini et al. | |

FOREIGN PATENT DOCUMENTS

WO   WO 2014/025722 A2   2/2014

OTHER PUBLICATIONS

Notification of Transmittal of the International Search Report and the Written Opinion of the International Searching Authority, or the Declaration; International Search Report and Written Opinion of the International Searching Authority for corresponding International application No. PCT/US2013/053702 mailed on Jan. 22, 2014, 12 pages.

* cited by examiner

*Primary Examiner* — Chandra Chaudhari
(74) *Attorney, Agent, or Firm* — Kilpatrick Townsend & Stockton LLP

(57) ABSTRACT

A method for fabricating an electronic device includes providing an engineered substrate structure comprising a III-nitride seed layer, forming GaN-based functional layers coupled to the III-nitride seed layer, and forming a first electrode structure electrically coupled to at least a portion of the GaN-based functional layers. The method also includes joining a carrier substrate opposing the GaN-based functional layers and removing at least a portion of the engineered substrate structure. The method further includes forming a second electrode structure electrically coupled to at least another portion of the GaN-based functional layers and removing the carrier substrate.

15 Claims, 13 Drawing Sheets

METHOD AND SYSTEM FOR GALLIUM NITRIDE ELECTRONIC DEVICES USING ENGINEERED SUBSTRATES

BACKGROUND OF THE INVENTION

Power electronics are widely used in a variety of applications. Power electronic devices are commonly used in circuits to modify the form of electrical energy, for example, from ac to dc, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to devices fabricating using engineered substrates to provide improvements in device performance parameters. The methods and techniques can be applied to a variety of compound semiconductor systems including vertical junction field effect transistors (JFETs), electrical contact structures, diode structures, and the like.

According to an embodiment of the present invention, a method for fabricating an electronic device is provided. The method includes providing an engineered substrate structure comprising a III-nitride seed layer, forming GaN-based functional layers coupled to the III-nitride seed layer, and forming a first electrode structure electrically coupled to at least a portion of the GaN-based functional layers. The method also includes joining a carrier substrate opposing the GaN-based functional layers and removing at least a portion of the engineered substrate structure. The method further includes forming a second electrode structure electrically coupled to at least another portion of the GaN-based functional layers and removing the carrier substrate.

According to another embodiment of the present invention, a vertical III-nitride electronic device is provided. The device includes a first electrical contact structure and a III-nitride epitaxial layer of a first conductivity type coupled to the first electrical contact structure. The device also includes a III-nitride epitaxial structure coupled to the III-nitride epitaxial layer and a second electrical contact structure coupled to one or more layers of the III-nitride epitaxial structure.

According to an alternative embodiment of the present invention, a vertical III-nitride JFET is provided. The vertical III-nitride JFET includes a device substrate, an interface layer coupled to the device substrate, and a first electrode structure coupled to the interface layer. The vertical III-nitride JFET also includes a III-nitride epitaxial layer connected to the first electrode structure, a III-nitride drift layer epitaxially coupled to the III-nitride epitaxial layer, and a III-nitride channel region epitaxially coupled to the III-nitride drift layer. The vertical III-nitride JFET further includes a III-nitride source region epitaxially coupled to the III-nitride channel region and one or more gate regions disposed adjacent the III-nitride channel region.

Numerous benefits are achieved by way of the present invention over conventional techniques. For example, embodiments of the present invention utilize an engineered substrate during the fabrication of high power, vertical GaN-based devices such as vertical FETs. The use of the engineered substrate results in cost reduction in some embodiments. Additionally, some embodiments are characterized by reduced substrate thinning and/or removal processes. For some vertical devices, particularly, high performance GaN-based devices, the substrate resistance is substantial and can impact device performance. In order to reduce resistance associated with the substrate, portions or all of the substrate can be thinned/removed after initial processing. Embodiments of the present invention utilize engineered substrates with predetermined GaN-based epitaxial layers that provide desired device characteristics after the handle substrate and bonding layers have been removed. These and other embodiments of the invention, along with many of its advantages and features, are described in more detail in conjunction with the text below and attached figures.

DETAILED DESCRIPTION OF SPECIFIC EMBODIMENTS

Figure 1:
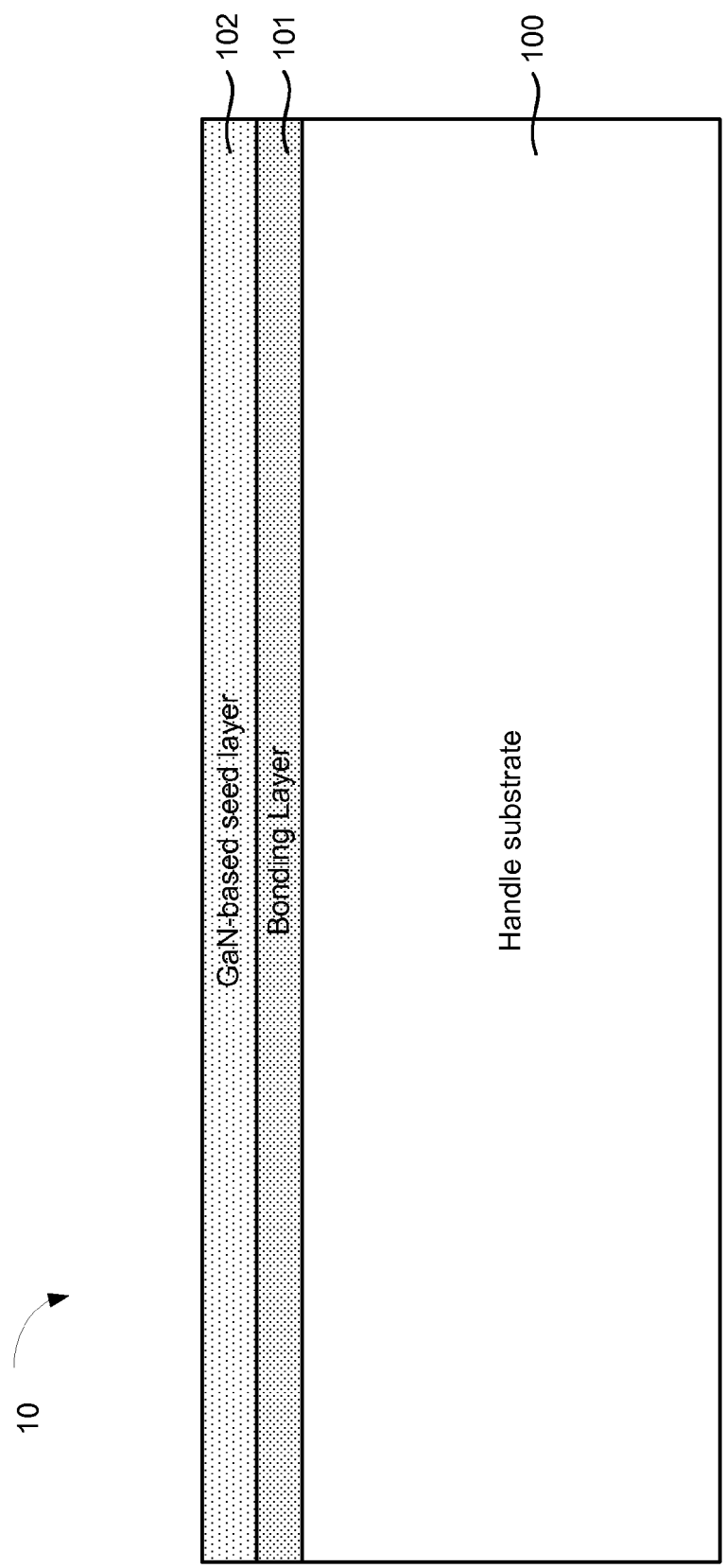
FIG. 1 is a simplified cross-sectional diagram illustrating an engineered substrate according to an embodiment of the present invention.

Embodiments of the present invention relate to electronic devices. More specifically, the present invention relates to devices fabricating using engineered substrates to provide improvements in device performance parameters. The methods and techniques can be applied to a variety of compound semiconductor systems including vertical junction field effect transistors (JFETs), electrical contact structures, diode structures, and the like.

GaN-based electronic and optoelectronic devices are undergoing rapid development. Desirable properties associated with GaN and related alloys and heterostructures include high bandgap energy for visible and ultraviolet light emission, favorable transport properties (e.g., high electron mobility and saturation velocity), a high breakdown field, and high thermal conductivity. According to embodiments of the present invention, gallium nitride (GaN) epitaxy on GaN seed layers formed on engineered substrates is utilized to fabricate vertical GaN-based semiconductor devices not possible using conventional techniques. For example, conventional methods of growing GaN include using a foreign substrate such as silicon carbide (SiC). This can limit the thickness of a usable GaN layer grown on the foreign substrate due to differences in thermal expansion coefficients and lattice constant between the GaN layer and the foreign substrate. High defect densities at the interface between GaN and the foreign substrate further complicate attempts to create vertical devices, including power electronic devices such as JFETs and other field-effect transistors.

Homoepitaxial GaN layers on GaN seed layers, on the other hand, are utilized in the embodiments described herein to provide superior properties to conventional techniques and devices. For instance, electron mobility, $\mu$, is higher for a given background doping level, N. This provides low resistivity, p, because resistivity is inversely proportional to electron mobility, as provided by equation (1):

$$\rho = \frac{1}{q\mu N}, \quad (1)$$

where q is the elementary charge.

Another superior property provided by homoepitaxial GaN layers on GaN seed layers is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by the equation:

$$R = \frac{\rho L}{A}, \quad (2)$$

where A is the cross-sectional area of the channel or current path.

In general, a tradeoff exists between the physical dimension of a device needed to support high voltage in a device's off-state and the ability to pass current through the same device with low resistance in the on-state. In many cases GaN is preferable over other materials in minimizing this tradeoff and maximizing performance. In addition, GaN layers grown on GaN seed layers on engineered substrates have low defect density compared to layers grown on mismatched substrates. The low defect density will give rise to superior thermal conductivity, less trap-related effects such as dynamic on-resistance, and better reliability.

Among the vertical device structures contemplated is a vertical JFET. Depending on doping levels, physical dimensions, conductivity type (e.g., n-type or p-type materials), and other factors, vertical JFETs can be designed to have normally-off or normally-on functionality. A normally-off vertical JFET is particularly useful due to its ability to prevent current flow if no voltage is applied to the gate, which can serve as, among other things, a safety feature for vertical JFETs used in power applications.

A normally-off vertical JFET can be created in various ways. For example, an n-type current path from source to drain can be gated on either side by p+ gates. With sufficiently low background doping, and high positive charge due to high hole concentration in the p+ gates, the channel can be depleted of carriers, or pinched off at zero bias. When a positive voltage is applied to the gate(s), the channel can be re-opened to turn the device on. Thus, in embodiments of the present invention, the vertical JFET is referred to as a vertical junction field effect transistor since the current flows vertically between the source and drain through the gated region.

In addition to the ability to support high-voltage, low-resistance JFET applications, the GaN vertical JFETs described herein can differ from traditional vertical JFETs in other ways. For example, other semiconductors used to manufacture vertical JFETs, such as SiC can be utilized, altering the mode of manufacture. Furthermore, the use of GaN epitaxial layers can allow for non-uniform dopant concentrations as a function of thickness within the various layers of the vertical JFET, which can optimize the performance of the device.

FIG. 1 is a simplified cross-sectional diagram illustrating an engineered substrate 10 according to an embodiment of the present invention. As illustrated in FIG. 1, the engineered substrate 10 includes a handle substrate 100, a bonding layer 101, and a GaN-based seed layer 102. In one embodiment, the bonding layer 101 is an oxide layer, but, as described more fully below, this is not required by embodiments of the present invention.

The handle substrate 100 provides mechanical rigidity to support overlying layers during handling and processing operations and can be made of a single material or combinations of materials in either a laminated structure, an alloy structure, or combinations thereof. As an example, the handle substrate can include metal materials, ceramic materials, semiconductor materials, or combinations thereof. As will be evident to one of skill in the art, the engineered substrate 10 shares some common features with silicon-on-insulator substrates used in silicon-based applications. The GaN seed layer 102 is epitaxially lifted off in some embodiments during the fabrication of the engineered substrate 10. In other embodiments, the GaN seed layer is a portion of a GaN substrate that is bonded to the bonding layer 101 and then split off from the substrate using a layer transfer process. One of ordinary skill in the art would recognize many variations, modifications, and alternatives.

The engineered substrate 10 can be utilized, as described herein, in the fabrication of high-power GaN-based electronic devices, providing cost reductions in comparison with conventional techniques, reducing processing related to thinning and removal of GaN-based substrate materials, and the like.

Figure 2:
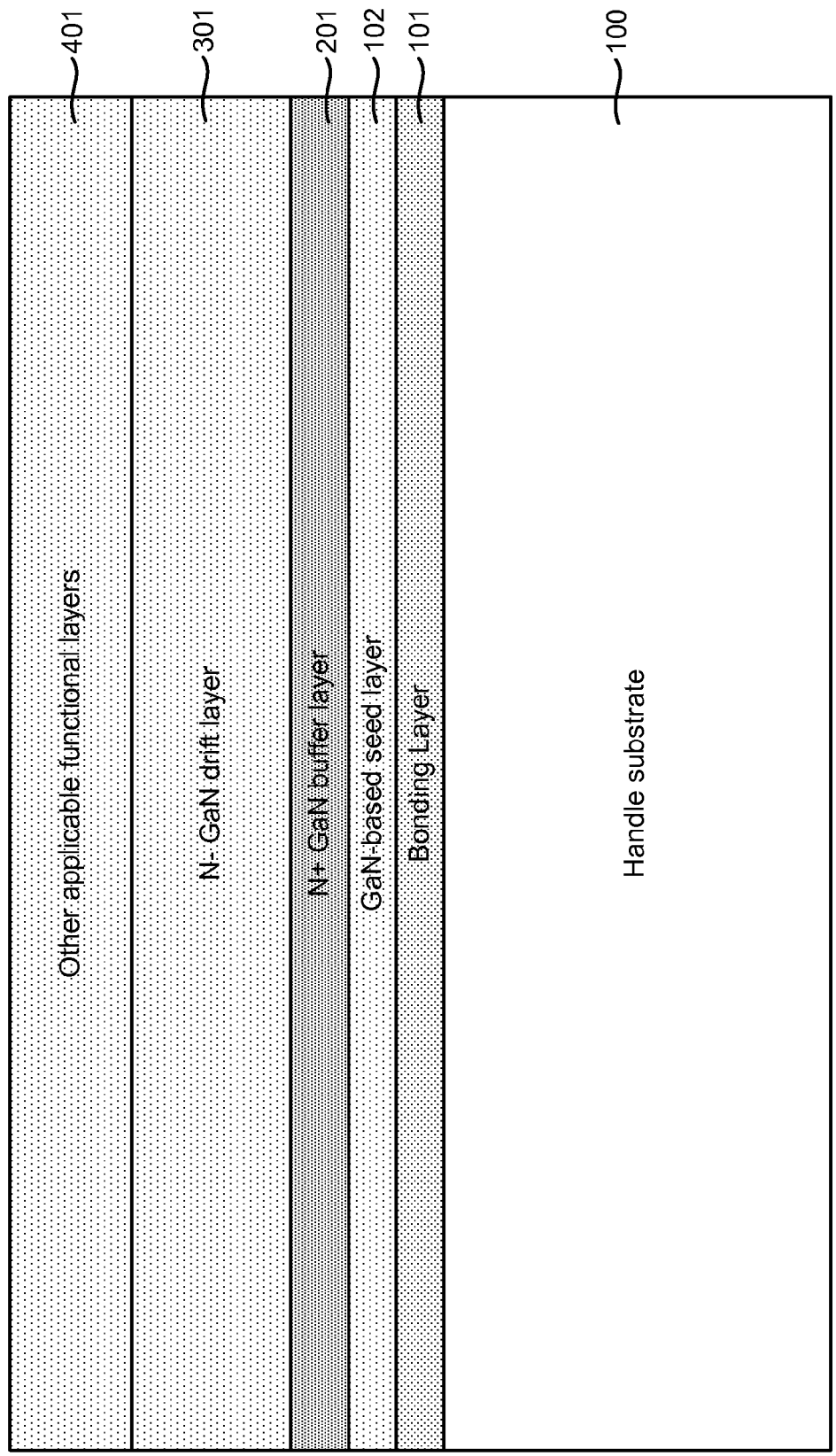
FIG. 2 is a simplified cross-sectional diagram illustrating epitaxial growth on the engineered substrate according to an embodiment of the present invention.

FIG. 2 is a simplified cross-sectional diagram illustrating epitaxial growth on the engineered substrate according to an embodiment of the present invention. As illustrated in FIG. 2, a buffer layer 201 (e.g., an n+ GaN buffer layer) is formed, for example, using a metalorganic chemical vapor deposition (MOCVD) process on the GaN-based seed layer 102. In the illustrated embodiment, the buffer layer is heavily doped n-type to form a highly conductive N+ layer since the seed layer can be highly resistive. For example, layer 201 may be doped with silicon or oxygen to a dopant concentration in the range of $1\times10^{17}$ cm$^{-3}$ to $1\times10^{20}$ cm$^{-3}$ and have a thickness in the range of 0.1 µm to 10 µm. A drift layer 301 (e.g., an n-type GaN drift layer), which forms an element of a vertical electronic device, is then formed on the buffer layer 201. Other functional layers 401 are then formed on the drift layer 301 and are intended to represent a wide variety of functional layers as appropriate to particular applications.

In some embodiments, after fabrication, the buffer layer 201 will serve as an n-type contact layer and the drift layer 301 will provide device functionality appropriate, for example, for a vertical JFET. The properties of drift layer 301 can vary, depending on desired functionality. For example, to support high voltages, layer 301 can be a relatively low-doped material with sufficient thickness. In some embodiments, the dopant concentration of layer 301 is substantially lower than the dopant concentration of layer 201. For example, layer 301 can have an n− conductivity type, with dopant concentrations ranging from $1\times10^{14}$ cm$^{-3}$ to $1\times10^{18}$ cm$^{-3}$. Furthermore, the dopant concentration can be uniform, or can vary, for example, as a function of the thickness of the drift region. The thickness of layer 301 may be in the range of 4 µm to 100 µm, depending on the target voltage rating. In some embodiments, layer 301 can comprise two or more sublayers, which can have differing physical characteristics (e.g., dopant concentrations, dopant uniformity, etc.).

Referring to FIGS. 1 and 2, GaN seed layer 102 may be substantially undoped, compensation-doped (i.e. have substantially equal concentrations of n-type and p-type doping, such that the net doping concentration is small), or may have net n-type doping or net p-type doping. Additionally, although a GaN seed layer is illustrated in FIGS. 1 and 2, embodiments of the present invention are not limited to GaN seed layers. Other III-V materials, in particular, III-nitride materials, are included within the scope of the present invention and can be substituted not only for the illustrated GaN seed layer, but also for other GaN-based layers and structures described herein. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention.

Figure 3:
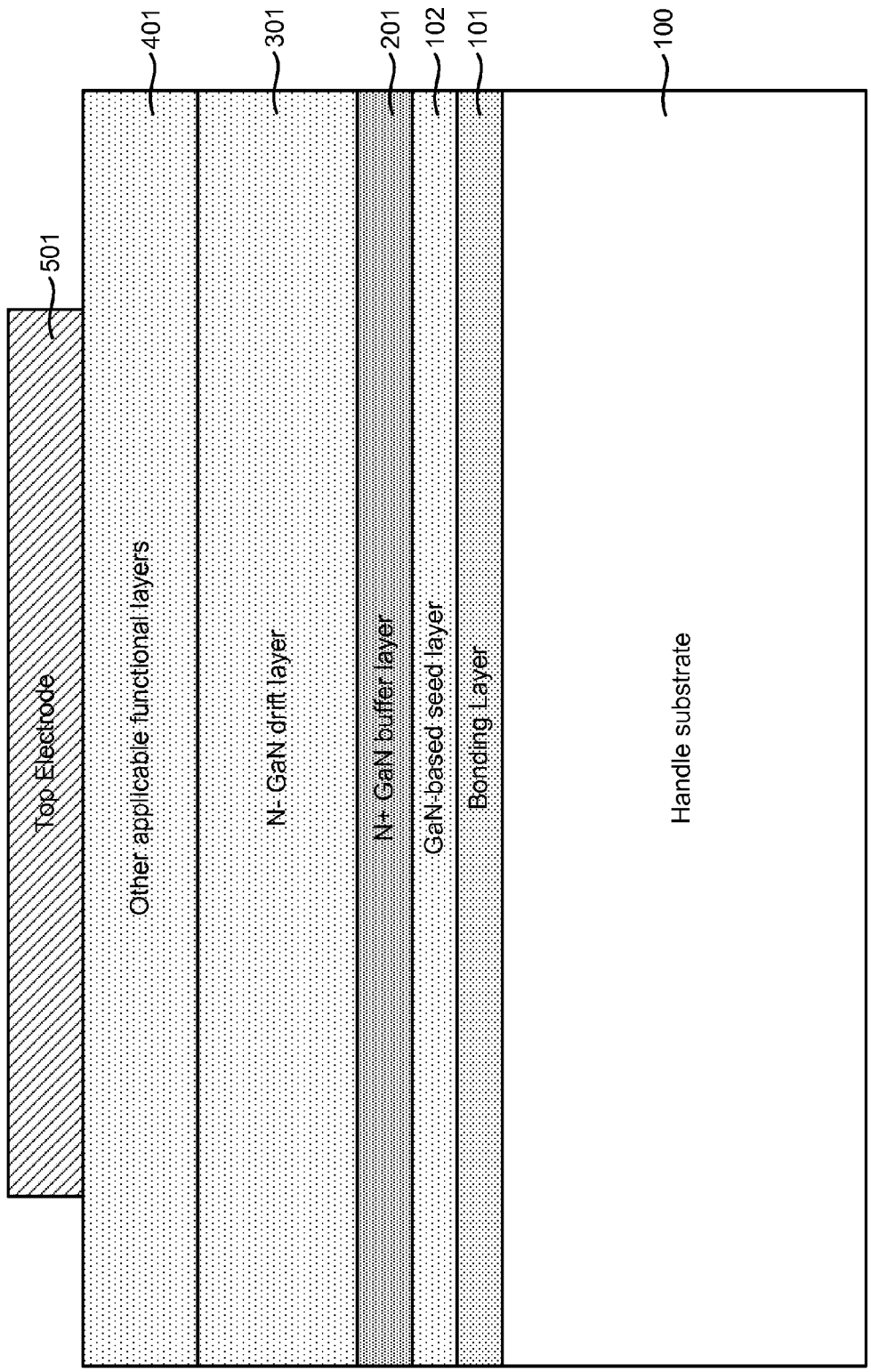
FIG. 3 is a simplified cross-sectional diagram illustrating formation of an electrode according to an embodiment of the present invention.

FIG. 3 is a simplified cross-sectional diagram illustrating formation of an electrode according to an embodiment of the present invention. A top electrode 501 is electrically connected to one or more of the other applicable functional layers 401 and the actual design and integration will depend on the particular device design and functionality provided by the particular device. As an example, the top electrode 501 can be formed from one or more layers of electrical conductors including a variety of metals to electrically couple the top electrode 501 to an electrical circuit (not illustrated).

Figure 4:
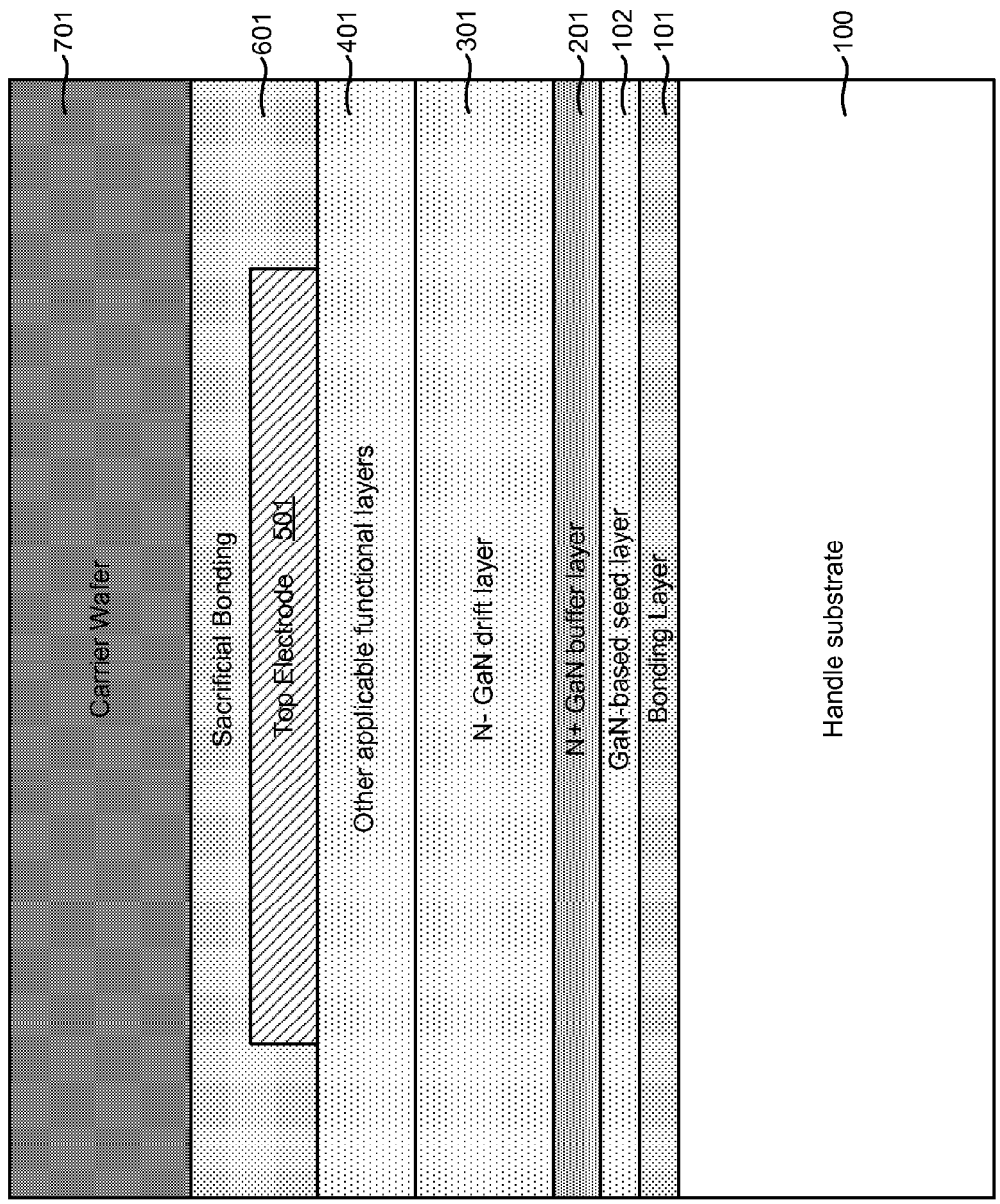
FIG. 4 is a simplified cross-sectional diagram illustrating joining of a carrier wafer according to an embodiment of the present invention.

FIG. 4 is a simplified cross-sectional diagram illustrating joining of a carrier wafer according to an embodiment of the present invention. Referring to FIG. 4, a sacrificial bonding layer 601 is joined to the top electrode 501 and portions of the other applicable functional layers 401 and provides mechanical support for the bonding of carrier wafer 701 to the material structure. As described more fully below, the carrier wafer 701 will enable subsequent processing to be used to remove the handle wafer and other suitable layers. One of ordinary skill in the art would recognize many variations, modifications, and alternatives.

In an embodiment, the material used to form the sacrificial bonding layer 601 can include wax, an oxide material, an organic tape, other organic or metallic materials suitable for bonding of the carrier wafer 701, combinations thereof, or the like. Typically, the sacrificial bonding layer 601 is a fairly soft material that is easily removed and provides for resistance to chemical attack during subsequent processing. In general, the sacrificial bonding layer 601 will be selected in light of the particular materials used for the carrier wafer in order to provide a good match to the carrier wafer. Thus, the sacrificial bonding layer 601 provides both adhesion and chemical resistance.

The material used to form the carrier wafer 701 can include rigid substrates such as sapphire, silicon carbide, silicon, and the like, or could include a more flexible material such as polyimide, plastic, or tape. Therefore, although the carrier wafer is illustrated as a wafer, embodiments of the are not limited to wafers/substrates and the present invention should be understood in a broader context. The carrier wafer 701 will provide sufficient rigidity to maintain the integrity of epitaxial layers during processing operations.

Figure 5:
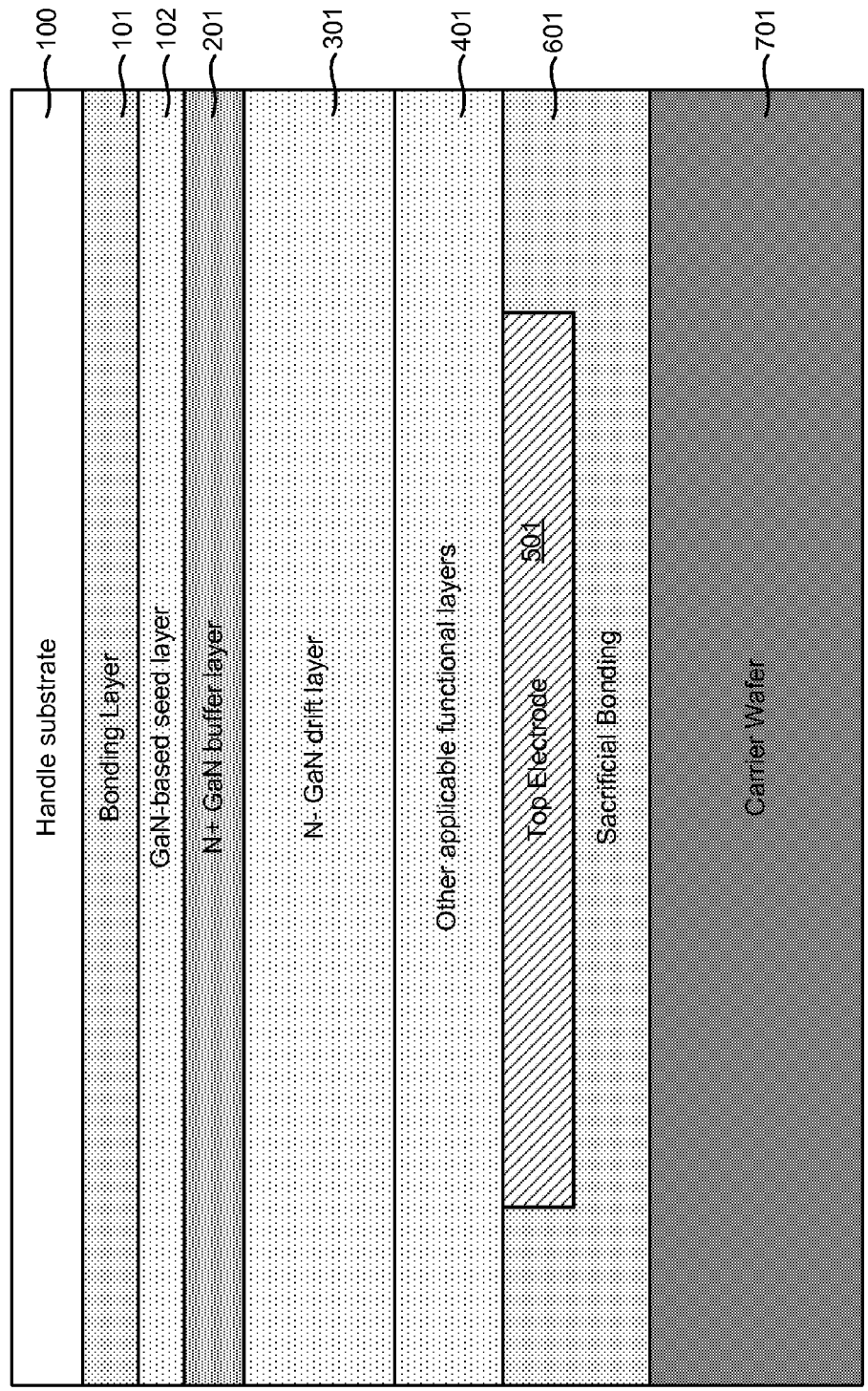
FIG. 5 is a simplified cross-sectional diagram illustrating thinning of the handle wafer according to an embodiment of the present invention.

FIG. 5 is a simplified cross-sectional diagram illustrating thinning of the handle wafer according to an embodiment of the present invention. Referring to FIG. 5, the structure illustrated in FIG. 4 has been inverted, with the carrier wafer 701 on the bottom and the handle substrate 100 on the top. Additionally, FIG. 5 illustrates partial removal of the handle substrate using, for example, a thinning, grinding, or other removal process. Although not illustrated in FIG. 5, the bonding layer 101 and the GaN-based seed layer 102 are removed using a thinning or other removal process to expose the GaN buffer layer 201. Thus, the seed layer, which had provided an epitaxial growth surface for the GaN buffer layer, is removed in some embodiments once the purpose of the seed layer (e.g., providing a high quality (for instance single-crystal) epitaxial growth surface) has been accomplished.

The handle substrate can be lapped, ground, or milled during a high removal rate process and then chemically etched, physically etched, or etched using a combination of chemical and physical etching (e.g., wet etch, CAIBE, dry etching using ICP, RIE, or the like). Similar etch processes are then used to remove the bonding layer 101 and the seed layer 102 to expose the buffer layer 201. Combinations of chemical etching, lapping, dry etching, and the like can be utilized depending on the particular materials. Since GaN is resistant to most wet etches, selective etches can be used to remove the bonding layer 101, which can include an oxide, nitride, or other suitable material that is removed during chemical etching in a manner that is selective for the underlying GaN-based seed layer 102. Thus, a combination of lapping and chemical etching can be used to remove the handle substrate 100 and the bonding layer 101 (e.g., bonding oxide) in some embodiments to thereby expose the GaN seed layer 102. The GaN seed layer can then be removed using a dry etch (e.g., ICP) that is suitable for the removal of GaN-based materials, and the GaN buffer layer 201 may be thick enough to allow for process margin in the event of over-etching. Depending on the doping type and structure of seed layer 102, a wet etch may also be used to remove seed layer 102 without substantially etching buffer layer 201. One of ordinary skill in the art would recognize many variations, modifications, and alternatives.

Figure 6:
FIG. 6 is a simplified cross-sectional diagram illustrating removal of layers and formation of an electrode according to an embodiment of the present invention.

FIG. 6 is a simplified cross-sectional diagram illustrating removal of layers and formation of an electrode according to an embodiment of the present invention. Comparing FIG. 5 to FIG. 6, the handle substrate, the bonding layer and the seed layer 102 have been removed as described above to expose the buffer layer 201 and a bottom electrode 801 has been deposited to provide for electrical contact to the n+ GaN buffer layer 201. In some embodiments, buffer layer 201 provides access to a nitrogen face of the GaN crystal structure after removal of the seed layer. Because the nitrogen face enables formation of good ohmic contacts using low temperature metal deposition processes, the formation of the bottom electrode 801 can be a low temperature process. In some embodiments, the bottom electrode 801 can be deposited at room temperature without the need for a post-deposition anneal. Various techniques can be used for contact formation, including metal evaporation, sputtering, plating, combinations thereof, or the like. Referring to FIG. 6, it should be noted that the use low temperature processes for the formation of the bottom electrode 801 enable the use of materials for the sacrificial bonding layer 601 that would not necessarily be available if a high temperature metallization process was used to form the bottom electrode 801. Additional description related to electrodes and metallization is provided in U.S. patent application Ser. No. 13/552,365, filed on Jul. 18, 2012, and entitled "GaN Power Device with Solderable Back Metal," the disclosure of which is hereby incorporated by reference in its entirety for all purposes.

Figure 7:
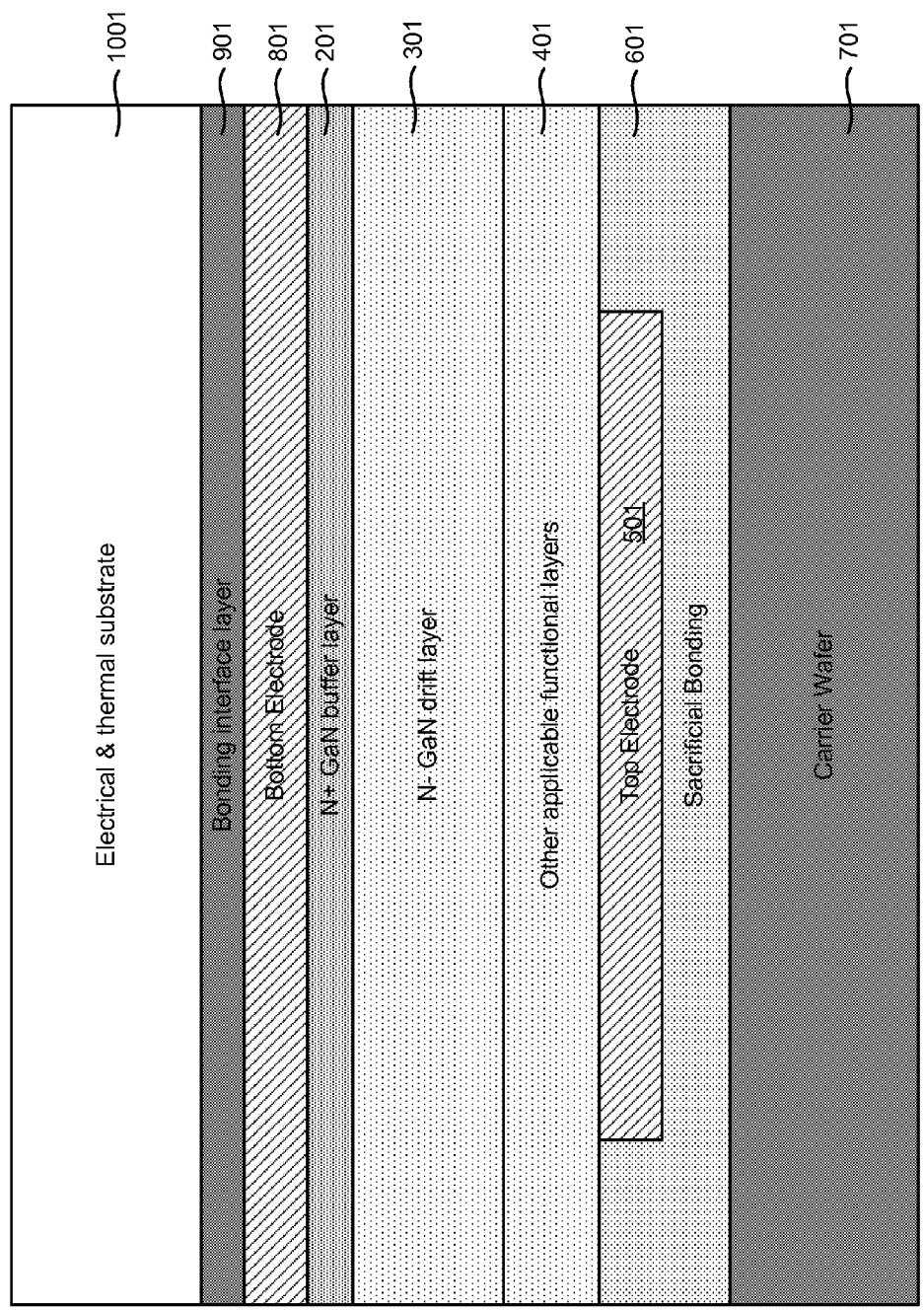
FIG. 7 is a simplified cross-sectional diagram illustrating joining of a substrate according to an embodiment of the present invention.

FIG. 7 is a simplified cross-sectional diagram illustrating joining of a substrate according to an embodiment of the present invention. As illustrated in FIG. 7, a device substrate 1001 (also referred to as an electrical and thermal substrate because of the properties discussed below) is joined to the bottom electrode 801 using a bonding interface layer 901. The electrical and thermal substrate 1001 provides electrical conductivity to devices fabricated using the epitaxial layers as well as thermal conductivity to conduct heat away from the active devices. As examples, the electrical and thermal substrate 1001 can include a variety of materials including molybdenum, copper, tungsten, similar metals, metal alloys, combinations thereof, or the like. As described below, the electrical and thermal substrate 1001 also provides mechanical support for the epitaxial device layers after removal of the carrier wafer 701. The electrical and thermal substrate can be joined to the illustrated structure using the bonding interface layer in conjunction with or supplemented by a soldering, sintering, or other suitable process.

As an alternative to the use of an electrical and thermal substrate, the bottom electrode 801 could be formed (e.g., plated) to a sufficient thickness to provide for mechanical support of the epitaxial layers. For example, bottom electrode 801 may include copper, nickel, aluminum, similar metals or alloys of several metals. In one embodiment, layer 801 may comprise a copper layer of 25 µm to 100 µm thickness formed by a chemical and/or electrochemical plating process. In some embodiments, the thickness and composition of top electrode 501 may be similar to bottom electrode 801, such that the mechanical stress caused by the mismatch in thermal coefficients of expansion (TCE) of these electrodes and GaN device layers is balanced. Thus, depending on the particular implementation, the electrical and thermal substrate may be utilized, whereas in other embodiments, alternative techniques are used to provide the desired mechanical, electrical, and thermal performance characteristics.

Figure 8:
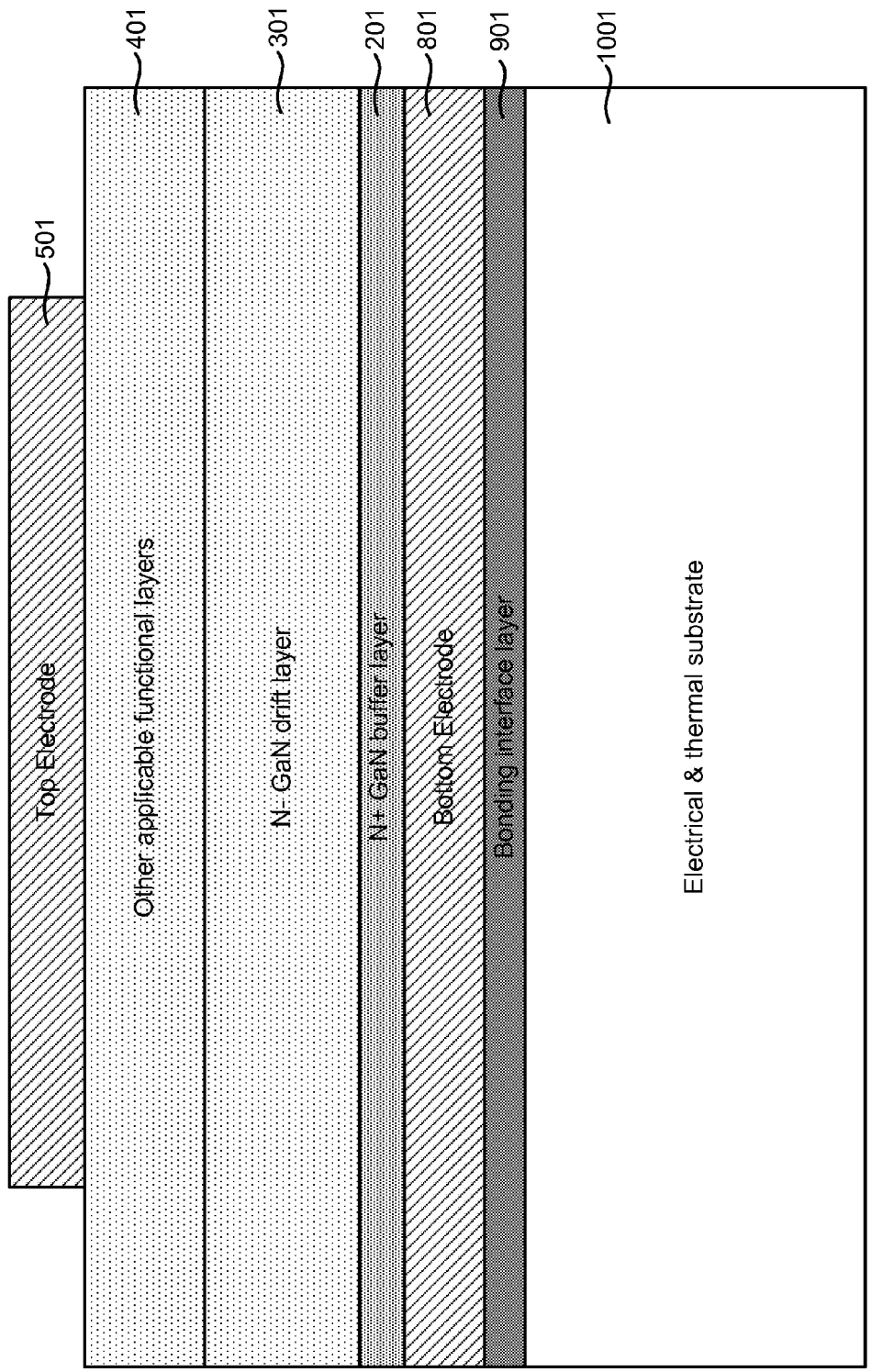
FIG. 8 is a simplified cross-sectional diagram illustrating removal of the carrier wafer according to an embodiment of the present invention.

FIG. 8 is a simplified cross-sectional diagram illustrating removal of the carrier wafer according to an embodiment of the present invention. As illustrated in FIG. 8, the carrier wafer has been debonded or removed along with the sacrificial bonding layer to expose the top electrode and portions of the other applicable functional layers. In embodiments in which the sacrificial bonding layer includes wax, an organic solvent can be used to remove this layer. As mentioned above, although an electrical and thermal substrate is illustrated in FIG. 8, this is not required by the present invention and plating of one or more layers, including extra plating of bottom electrode 801 can be used to provide mechanical support for the device layers. In a particular embodiment, at least one of the top electrode or the bottom electrode are plated to a sufficient thickness to provide mechanical support, for example 25 µm of copper for the top electrode and 25 µm of copper for the bottom electrode. In this particular embodiment, stress balancing of the top electrode 501 and the bottom electrode 801 can be utilized to place the epitaxial device layers in compressive stress.

Utilizing the engineered substrate during the fabrication process results in a device structure substantially free of substrate material since the GaN substrate characterizing conventional devices has been replaced with the GaN buffer layer 201, which can be very thin in comparison to a conventional substrate. For example, a bulk GaN wafer may have a starting thickness of 300 µm to 500 µm, depending on the wafer diameter. Because the substrate is in series with the electrical current flow and the heat flow, it adds significantly to both the electrical and thermal resistance. In conventional vertical power device processing on bulk substrates, the substrate is preferably thinned to reduce its thermal and electrical resistance. However, the minimum final substrate thickness is limited by handling and mechanical stress issues. In state-of-the-art vertical power devices, the final substrate thickness may be in the range of 50 µm to 150 µm. According to the embodiments described herein, the equivalent final "substrate" thickness is the same as the thickness of N+ GaN buffer layer 301, which may be in the range of 1 µm to 10 µm. Thus, the present invention provides vertical GaN power devices with much lower electrical and thermal resistance compared to vertical GaN power devices fabricated on bulk GaN substrates.

Figure 9B:
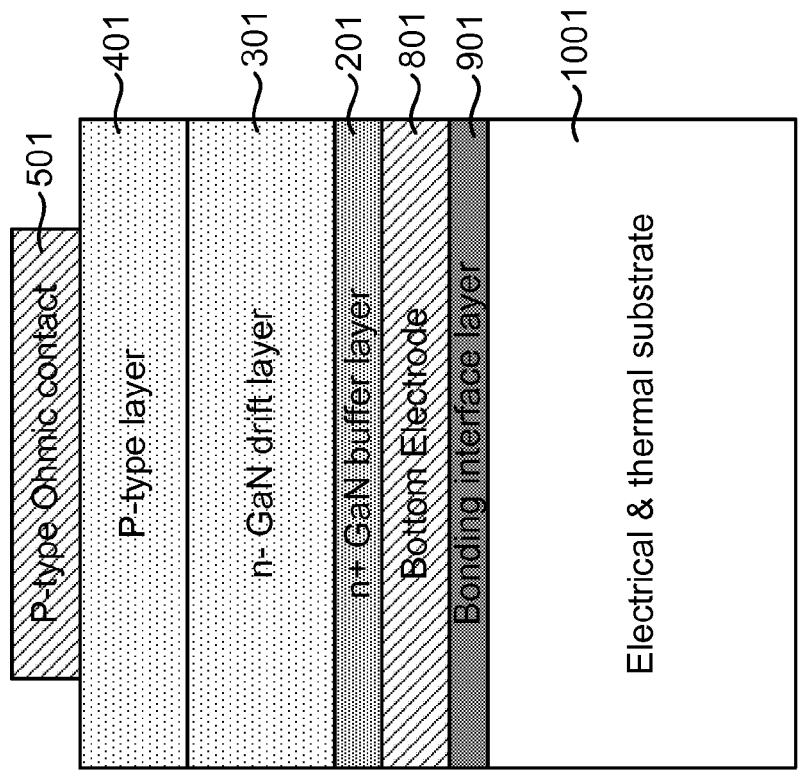
FIG. 9B is a simplified schematic diagram of a GaN p-n diode structure according to an embodiment of the present invention.
Figure 9A:
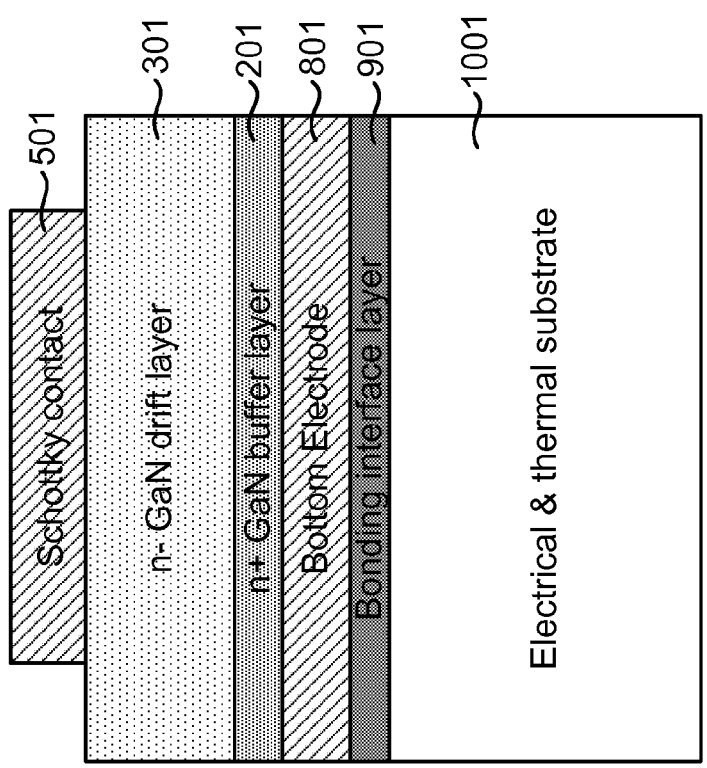
FIG. 9A is a simplified schematic diagram of a GaN Schottky diode structure according to an embodiment of the present invention.

FIG. 9A is a simplified schematic diagram of a GaN Schottky diode structure according to an embodiment of the present invention. The GaN Schottky diode structure illustrated in FIG. 9A is an example of a two-terminal GaN-based device that utilizes the epitaxial structure fabricated using the engineered substrate process described herein. Additional description related to Schottky diode structures is provided in U.S. patent application Ser. No. 13/225,345, filed on Sep. 2, 2011 and U.S. patent application Ser. No. 13/289,219, filed on Nov. 4, 2011, the disclosures of which are hereby incorporated by reference in their entirety for all purposes. As illustrated in FIG. 9A, a Schottky contact is formed as the top electrode, providing a Schottky barrier to lightly doped n-type GaN-based drift layer.

By using an engineered substrate to fabricate the device illustrated in FIG. 9A, as well as other devices described herein, only epitaxial material is present between the bottom electrode and the Schottky contact. As discussed in relation to the other devices described herein, embodiments of the present invention utilize the engineered substrate to remove the substrate material that is typically present in conventional devices. Thus, the buffer layer and the drift layer, in the device illustrated in FIG. 9A, are both epitaxial layers that are grown using the seed layer, with the seed layer subsequently removed, resulting in only epitaxial material being present in the layers between the contacts. Because the device structure is free of substrate material, the material properties are defined by the epitaxial growth processes, which provide more control for device design and fabrication.

The removal of the substrate material enables the fabrication of device structures that are thinner than conventional devices, for example, with the thickness of the buffer layer (i.e., the distance measured from the bottom electrode to the III-nitride drift layer) being less than 5 µm, less than 4 µm, less than 3 µm, less than 2 µm, less than 1 µm, less than 0.5 µm, less than 0.1 µm, or the like, which is appropriate for a structure with only a buffer layer between the original seed layer and the drift layer. Additionally, embodiments of the present invention contrast with conventional devices since the III-nitride epitaxial layers, including the buffer and drift layer, are silicon-doped n-type layers, rather than being oxygen doped, which is the conventional dopant for n-type GaN substrates. Thus, the buffer layer utilized in the illustrated devices are characterized by an oxygen concentration less than $5 \times 10^{17}$ cm$^{-3}$ (for example, less than $2 \times 10^{17}$ cm$^{-3}$), which is an oxygen concentration associated with GaN substrates. Additionally, the silicon concentration of the buffer layer can be greater than $1 \times 10^{18}$ cm$^{-3}$. Thus, devices fabricated using engineered substrates provide lower electrical resistance, lower thermal resistance, and the like because of the absence of the substrate material.

FIG. 9B is a simplified schematic diagram of a GaN p-n diode structure according to an embodiment of the present invention. The GaN p-n junction diode structure illustrated in FIG. 9B is another example of a two-terminal GaN-based device that utilizes the epitaxial structure fabricated using the engineered substrate process described herein. Additional description related to p-n junction diode structures is provided in U.S. patent application Ser. No. 13/225,345, filed on Sep. 2, 2011 and U.S. patent application Ser. No. 13/289,219, filed on Nov. 4, 2011, the disclosures of which are hereby incorporated by reference in their entirety for all purposes. As illustrated in FIG. 9B, a p-type ohmic contact is formed as the top electrode, providing an ohmic contact to p-type GaN-based layer, which forms a p-n junction with lightly doped n-type GaN-based drift layer.

In addition to Schottky diode and p-n junction diode devices, a merged PIN, Schottky (MPS) diode structure can be fabricated using engineered substrates as described herein. Additional description related to MPS diodes is provided in U.S. patent application Ser. No. 13/300,028, filed on Nov. 18, 2011, the disclosure of which is hereby incorporated by reference in its entirety for all purposes.

Figure 10:
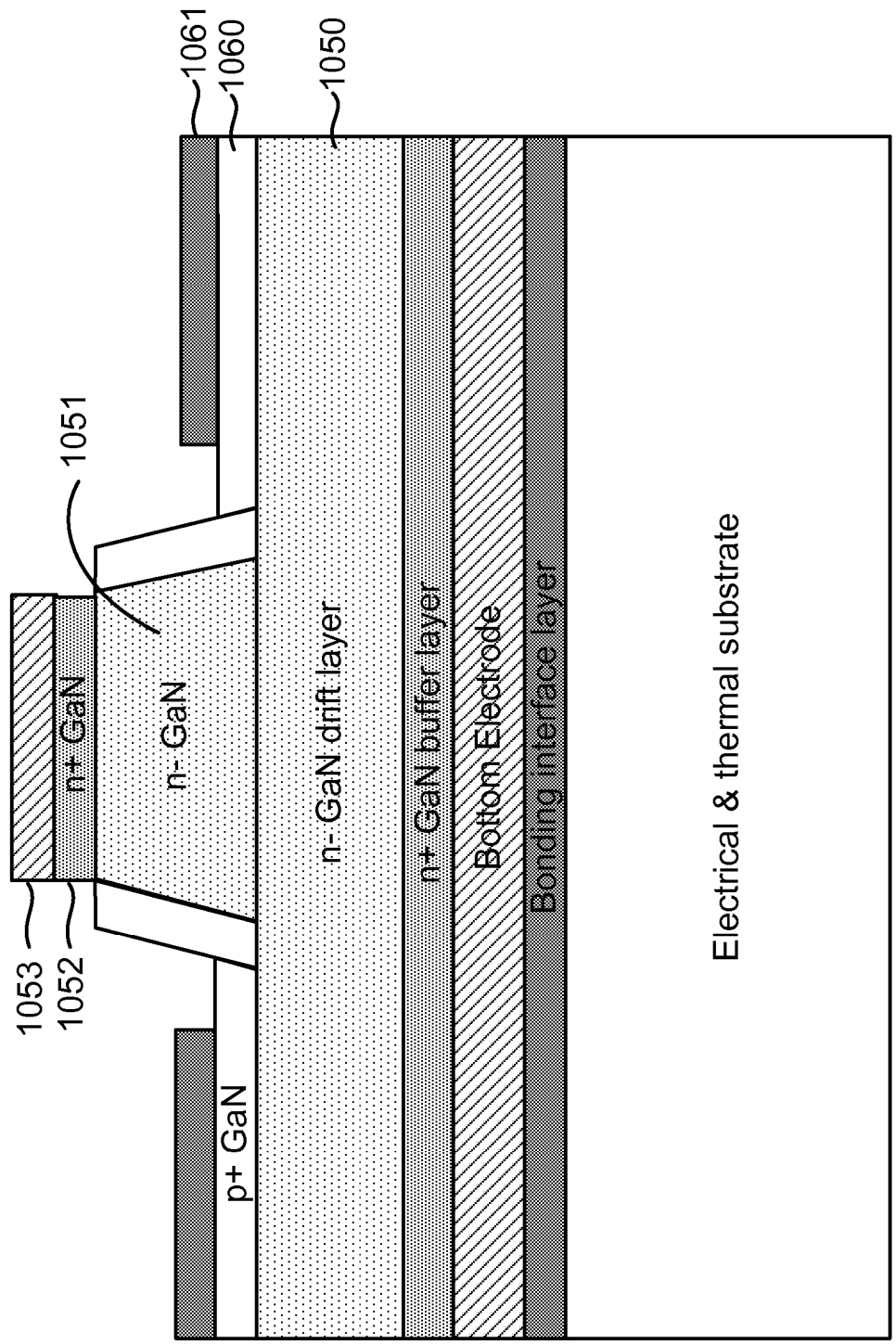
FIG. 10 is a simplified schematic diagram of a three-terminal GaN FET structure according to an embodiment of the present invention.

FIG. 10 is a simplified schematic diagram of a three-terminal GaN FET structure according to an embodiment of the present invention. The three-terminal device illustrated in FIG. 10 is a vertical junction field effect transistor (JFET), which can be fabricated using techniques discussed in more detail in U.S. patent application Ser. No. 13/198,655, filed on Aug. 4, 2011, the disclosure of which is hereby incorporated by reference in its entirety for all purposes. As illustrated in FIG. 10, the vertical JFET includes a lightly doped n-type GaN-based drift layer 1050 and a lightly doped GaN-based channel region 1051. Gate material 1060 (e.g., a p-type GaN-based layer) is biased by application of voltage to metal 1061, which forms an ohmic contact to the p-type gate material. The source region 1052 is biased by application of voltage to source metal 1053, which forms an ohmic contact to the heavily doped n-type source region. Because the structure illustrated in FIG. 10 utilized an engineered substrate during fabrication, voltage drop associated with a GaN substrate is reduced since the bottom electrode is connected to the heavily doped n-type GaN buffer layer and the drift layer 1050.

Figure 11:
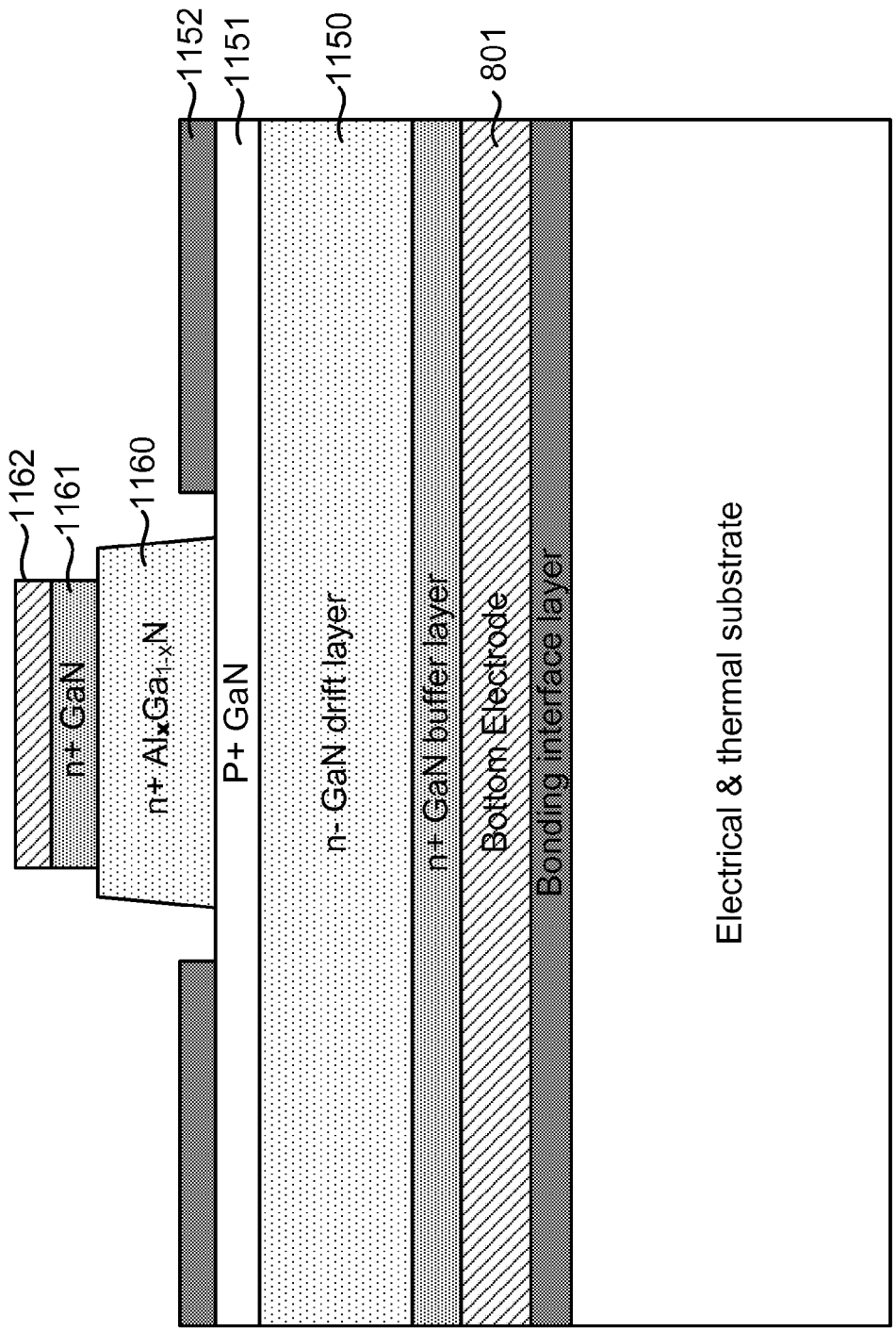
FIG. 11 is a simplified schematic diagram of a three-terminal GaN bipolar structure according to an embodiment of the present invention.

FIG. 11 is a simplified schematic diagram of a three-terminal GaN bipolar structure according to an embodiment of the present invention. Referring to FIG. 11, the functional layers include a heavily doped p-type base 1151 positioned between a lightly doped n-type drift layer 1150 connected to the bottom electrode 801 (collector) and a heavily doped emitter structure including an n-type $Al_xGa_{1-x}N$ layer 1160, an n-type GaN layer 1161, and an ohmic metal contact 1162 (emitter) to the n-type GaN layer 1161. Current entering the base 1151, biased using an ohmic contact 1152 to the p-GaN layer is amplified to produce the collector and emitter current. Although an NPN BJT is illustrated in FIG. 11, this is not required by the present invention and PNP designs can be utilized as well. Doping and thickness of the various layers of the BJT are selected to provide predetermined device characteristics appropriate to the particular design. One of ordinary skill in the art would recognize many variations, modifications, and alternatives.

Figure 12:
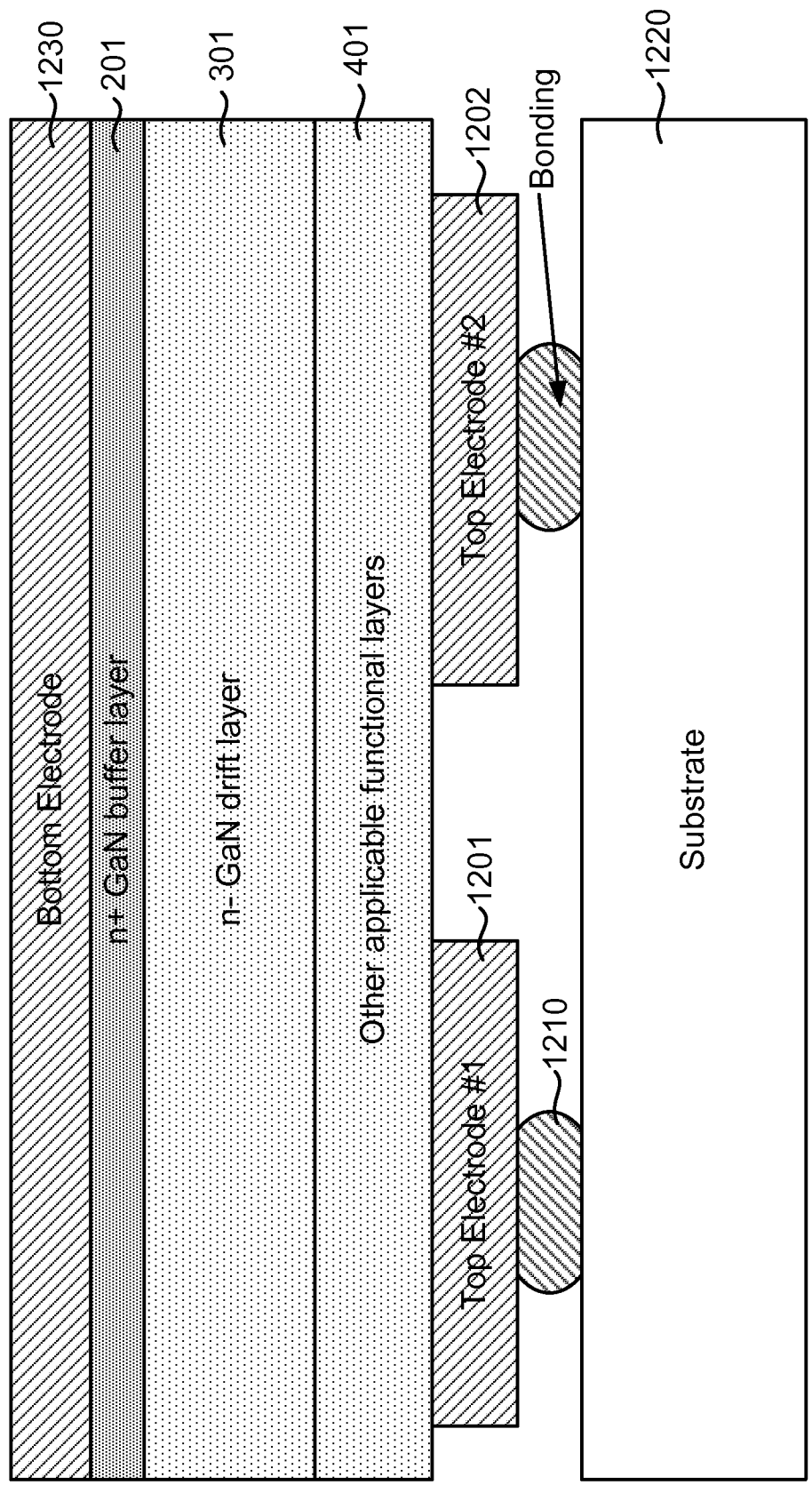
FIG. 12 is a simplified schematic diagram illustrating device bonding according to an embodiment of the present invention.

FIG. 12 is a simplified schematic diagram illustrating device bonding according to an embodiment of the present invention. FIG. 12 presents an alternative design to the use of an electrical and thermal substrate as illustrated in FIG. 8. As illustrated in FIG. 12, the GaN buffer layer 201, the GaN drift layer 301, the other applicable functional layers 401, and the top electrodes (#1 and #2) are illustrated and can be compared to these layers in FIG. 3. Multiple top electrodes 1201 and 1202 are fabricated in the embodiment illustrated in FIG. 12. The structure is then flip-chip bonded to substrate 1220 using bonds 1210. Thus, flip-chip bonding can be used after the formation of the functional layers to bond the structure to substrate 1220. Removal of the handle substrate 100 along with bonding layer and the seed layer is then performed prior to formation of the bottom electrode 1230.

In some embodiments using three-terminal devices, substrate 1220 can include wire traces and/or insulated interconnects connected to bonding regions to provide separate electrical circuits for a first top electrode 1201 and a second top electrode 1202. An example is a design using direct bonded copper (DBC). The top electrodes can be formed using plating as described above. Thus, using the design illustrated in FIG. 12, both electrical contact to the substrate as well as thermal conduction to remove device heat can be provided by the substrate.

Figure 13:
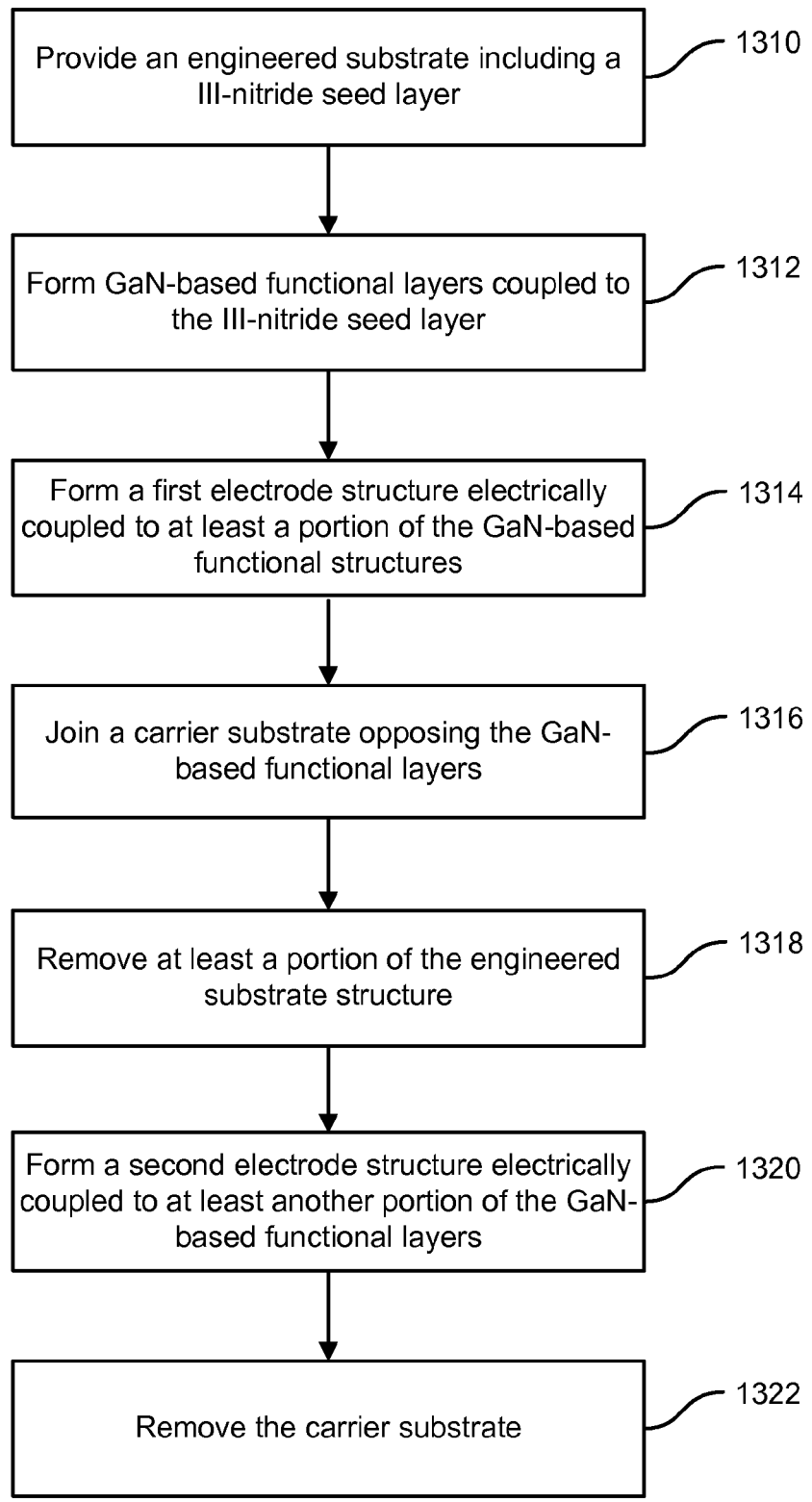
FIG. 13 is a simplified flowchart illustrating a method of fabricating an electronic device according to an embodiment of the present invention.

FIG. 13 is a simplified flowchart illustrating a method of fabricating an electronic device according to an embodiment of the present invention. The method 1300 includes providing an engineered substrate structure comprising a III-nitride seed layer (1310) and forming GaN-based functional layers coupled to the III-nitride seed layer. In an embodiment, the III-nitride seed layer includes GaN material, such as a portion of a GaN substrate removed during a layer transfer process, for example, an n-type GaN-based material. In some embodiments, the method includes epitaxially growing a III-nitride buffer layer coupled to the III-nitride seed layer and a III-nitride drift layer coupled to the III-nitride buffer layer. In these embodiments, the method can additionally include epitaxially growing the GaN-based functional layers in order to form the GaN-based functional layers.

The method also includes forming a first electrode structure electrically coupled to at least a portion of the GaN-based functional layers (1314) and joining a carrier substrate opposing the GaN-based functional layers (1316).

Joining the carrier wafer to the GaN-based functional layers can include forming an electrode structure coupled to at least a portion of one of the GaN-based functional layers, forming a sacrificial bonding layer coupled to another portion of the one of the GaN-based functional layers and at least a portion of the electrode structure, and bonding the carrier wafer to the sacrificial bonding layer.

The method further includes removing at least a portion of the engineered substrate structure (1318) and forming a second electrode structure electrically coupled to at least another portion of the GaN-based functional layers (1320). Additionally, the method includes removing the carrier substrate (1322). In a particular embodiment, removing the carrier substrate includes removing the sacrificial bonding layer discussed above. As described herein, the engineered substrate can include a handle wafer and a bonding layer coupled to the III-nitride seed layer. In this embodiment, removing at least a portion of the engineered substrate structure can include mechanically removing the handle wafer, chemically etching the bonding layer, and physically etching the III-nitride seed layer. Thus, embodiments provide structures that are substantially free from substrate materials, rather using epitaxially grown materials to form the device layers.

In some embodiments, the method can also include joining a device substrate to the second electrode prior to removing the carrier substrate, whereas in other embodiments, the second electrode is plated to a thickness such that a device substrate is not utilized, with the structure of the second electrode providing sufficient mechanical support for other layers during fabrication and packaging processes.

It should be appreciated that the specific steps illustrated in FIG. 13 provide a particular method of fabricating an electronic device according to an embodiment of the present invention. Other sequences of steps may also be performed according to alternative embodiments. For example, alternative embodiments of the present invention may perform the steps outlined above in a different order. Moreover, the individual steps illustrated in FIG. 13 may include multiple substeps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A vertical III-nitride electronic device comprising:
a first electrical contact structure;
a III-nitride epitaxial buffer layer of a first conductivity type contacting the first electrical contact structure;
a III-nitride epitaxial drift layer contacting the III-nitride epitaxial buffer layer; and
a second electrical contact structure contacting the III-nitride epitaxial drift layer.

2. The vertical III-nitride electronic device of claim 1 wherein the III-nitride epitaxial buffer layer comprises an n-type GaN layer.

3. The vertical III-nitride electronic device of claim 1 wherein the first conductivity type comprises an n-type.

4. The vertical III-nitride electronic device of claim 1 wherein the III-nitride epitaxial drift layer comprises an n-type GaN layer and one or more additional GaN layers.

5. The vertical III-nitride electronic device of claim 1 wherein a thickness of the III-nitride epitaxial buffer layer and the III-nitride epitaxial buffer layer is between about 1 μm and about 100 μm.

6. The vertical III-nitride electronic device of claim 1 further comprising a device substrate supporting the first electrical contact structure.

7. A vertical III-nitride JFET comprising:
a device substrate;
an interface layer coupled to the device substrate;
a first electrode structure coupled to the interface layer;
a III-nitride epitaxial layer connected to the first electrode structure;
a III-nitride drift layer epitaxially coupled to the III-nitride epitaxial layer;
a III-nitride channel region epitaxially coupled to the III-nitride drift layer;
a III-nitride source region epitaxially coupled to the III-nitride channel region; and
one or more gate regions disposed adjacent the III-nitride channel region,
wherein the interface layer, the first electrode structure, the III-nitride epitaxial layer, the III-nitride drift layer, the III-nitride channel region, and the III-nitride source region are all on the same side of the substrate.

8. The vertical III-nitride JFET of claim 7 further comprising a source electrode structure coupled to the III-nitride source region.

9. The vertical III-nitride JFET of claim 7 further comprising one or more gate electrode structures coupled to the one or more gate regions.

10. The vertical III-nitride JFET of claim 7 wherein a thickness of the interface layer ranges from about 0.1 μm to about 1 μm.

11. The vertical III-nitride JFET of claim 7 wherein a thickness of the III-nitride drift layer ranges from about 1 μm to about 100 μm.

12. The vertical III-nitride JFET of claim 7 wherein a distance measured from the first electrode structure to the III-nitride drift layer is less than 10 μm.

13. The vertical III-nitride JFET of claim 7 wherein the III-nitride epitaxial layer and the III-nitride drift layer are silicon-doped n-type layers.

14. The vertical III-nitride JFET of claim 7 wherein the III-nitride epitaxial layer and the III-nitride drift layer are characterized by an oxygen concentration less than $2\times10^{18}$ $cm^{-3}$.

15. The vertical III-nitride JFET of claim 13 wherein the III-nitride epitaxial layer is characterized by a silicon concentration greater than $1\times10^{18}$ $cm^{-3}$.

* * * * *